United States Patent
Davies

(10) Patent No.: US 9,531,297 B2
(45) Date of Patent: Dec. 27, 2016

(54) SOLAR POWER CONVERSION SYSTEM

(75) Inventor: Kevin Stephen Davies, Duncraig (AU)

(73) Assignee: Kevin Stephen Davies, Duncraig (AU)

( * ) Notice: Subject to any disclaimer, the term of this patent is extended or adjusted under 35 U.S.C. 154(b) by 971 days.

(21) Appl. No.: 13/813,689

(22) PCT Filed: Aug. 4, 2011

(86) PCT No.: PCT/AU2011/000985
§ 371 (c)(1),
(2), (4) Date: Mar. 29, 2013

(87) PCT Pub. No.: WO2012/016285
PCT Pub. Date: Feb. 9, 2012

(65) Prior Publication Data
US 2013/0200711 A1    Aug. 8, 2013

(30) Foreign Application Priority Data

Aug. 4, 2010 (AU) .................. 2010903477
Aug. 10, 2010 (AU) .................. 2010903566
(Continued)

(51) Int. Cl.
*H02M 7/537* (2006.01)
*H01L 31/02* (2006.01)
(Continued)

(52) U.S. Cl.
CPC ........ *H02M 7/537* (2013.01); *H01L 31/02021* (2013.01); *H02J 3/385* (2013.01);
(Continued)

(58) Field of Classification Search
CPC .......... Y02E 110/58; H02J 3/385; H02J 7/35; H02J 7/345; Y10T 307/685; H02M 7/49; H01L 31/02021
(Continued)

(56) References Cited

U.S. PATENT DOCUMENTS 5,668,713 A * 9/1997 Eguchi .............. H02M 7/53871
                                                    363/95
5,677,833 A    10/1997 Bingley
(Continued)

FOREIGN PATENT DOCUMENTS

EP          2017948 A2    1/2009
JP          2003195957    7/2003

OTHER PUBLICATIONS

PCT International Search Report regarding Application No. PCT/AU2011/000985 filed Aug. 4, 2011, a counterpart to U.S. Appl. No. 13/813,689.
(Continued)

*Primary Examiner* — Terrence Willoughby
(74) *Attorney, Agent, or Firm* — Warner Norcross & Judd LLP

(57) ABSTRACT

A power conversion system (10) for converting power from a plurality of solar panels. The system (10) comprises a plurality of panel modules (14) each having an input (16) and an output (17) and being connected in series. Each panel module (14) is connected to at least one solar panel (12) that supplies power to the panel module (14). Voltage control circuitry is provided within each of the panel modules (14) to vary the voltage supplied between the input (16) and the output (17) between a maximum module voltage and a minimum module voltage. A control unit (29) in communication with the voltage control circuitry of each of the panel modules varies the voltage supplied across the input (16) and output (17) of each of the panel modules (14) such that the total voltage across the series connected panel modules (14) forms an AC signal or a rectified version of an AC signal.

34 Claims, 3 Drawing Sheets

(30) Foreign Application Priority Data

Sep. 24, 2010 (AU) ................................ 2010904317
Jun. 17, 2011 (AU) ................................ 2011902366

(51) Int. Cl.
*H02M 7/49* (2007.01)
*H02J 3/38* (2006.01)
*H02J 7/35* (2006.01)
*H02J 7/34* (2006.01)

(52) U.S. Cl.
CPC ................ *H02J 7/35* (2013.01); *H02M 7/49* (2013.01); *H02J 7/345* (2013.01); *Y02E 10/58* (2013.01); *Y10T 307/685* (2015.04)

(58) Field of Classification Search
USPC ......................................................... 307/77
See application file for complete search history.

(56) References Cited

U.S. PATENT DOCUMENTS

| | | | |
|---|---|---|---|
| 5,896,281 A | 4/1999 | Bingley | |
| 2010/0308660 A1* | 12/2010 | Willis | G05F 1/67 307/77 |
| 2011/0121652 A1* | 5/2011 | Sella | H01L 31/02021 307/43 |
| 2011/0156484 A1* | 6/2011 | Chiang | G05F 1/67 307/71 |

OTHER PUBLICATIONS

PCT International Written Opinion regarding Application No. PCT/AU2011/000985 filed August 4, 2011, a counterpart to U.S. Appl. No. 13/813,689.

* cited by examiner

SOLAR POWER CONVERSION SYSTEM

FIELD OF THE INVENTION

The present invention relates to a system and method for converting power generated by solar panels into a form suitable for use in the power industry.

BACKGROUND TO THE INVENTION

Solar power generation currently comprises wiring a number of solar panels together to supply DC power to an inverter. The solar panels are generally connected in series such that the DC voltage generated is higher than the required AC voltage and an inverter converts this DC voltage into AC power at the required mains voltage.

For traditional inverters, the conversion efficiency is generally in the range of 92% to 96% and this value varies with the level of sunlight and voltage provided by the solar cells. Transformerless inverters can reach efficiencies as high as 98% at an optimal supply voltage and power. Typically the efficiency drops 2 to 5% when operating away from this optimal point.

Solar cells have an optimal operating voltage. This is the voltage at Maximum Power Point (MPP). The MPP varies according to the sunlight on the panel, the temperature and age of the panel. Modern inverters are provided with a means to control their power output thereby operating their solar cells at the MPP and a means to track and adjust this power level. Temperature sensors to measure the panel temperature and control the panel voltage accordingly have also been used.

The present invention relates to a system for converting the DC power generated from solar panels to AC power. The system is aimed at providing greater efficiency and a number of other advantages, including control of the panel voltage in a manner that will allow each panel to operate near its maximum power point and a means to safely shutdown the system for maintenance.

SUMMARY OF THE INVENTION

According to one aspect of the present invention there is provided a power conversion system for converting power from a plurality of solar panels, the system comprising:

a plurality of panel modules each having an input and an output and being connected in series such that the output of any panel module is connected to the input of a subsequent panel module, each panel module being connected to at least one solar panel that supplies power to the panel module;

voltage control circuitry provided within each of the panel modules in connection with the solar panel to vary the voltage supplied between the input and the output by the solar panel between a maximum module voltage and a minimum module voltage;

a control unit in communication with the voltage control circuitry of each of the panel modules;

wherein the control unit varies the voltage supplied across the input and output of each of the panel modules such that the total voltage across the series connected panel modules forms an AC signal or a rectified version of an AC signal.

Preferably the control unit is in communication with a mains supply to receive information regarding the phase of the mains signal and the control unit controls the panel modules such that the AC signal or rectified AC signal is in phase with the mains supply.

Preferably each of the panel modules includes one or more storage devices in connection with the solar panel such that the solar panel charges the storage devices when the panel module is not supplying power to the system.

In one embodiment, the minimum module voltage is the reverse polarity of the maximum module voltage and the control unit varies the voltages supplied by the panel modules to form an AC signal. Preferably the voltage control circuitry comprises switching devices connected such that the switching devices are operable to connect the storage devices between the input and the output in a first direction to provide the maximum module voltage, in a second opposite direction to provide the minimum module voltage and operable to bypass the storage devices.

In a further embodiment, the minimum module voltage is the voltage across the panel module when the storage devices are bypassed and the control unit varies the voltages supplied by the panel modules to form a rectified AC signal. Preferably the voltage control circuitry comprises switching devices connected such that the switching devices are operable to connect the storage devices between the input and the output in a first direction to provide the maximum module voltage and operable to bypass the storage devices to provide zero voltage between the input and output. The control unit preferably includes circuitry to reverse the voltage from the series connected panels every half cycle so that the resulting voltage forms an AC signal.

In a preferred embodiment, a switching regulator is provided in each panel module connected to the storage device to control the voltage provided by the storage device across the input and output such that the voltage applied is ramped up or down to more closely approximate the mains signal.

The switching regulator preferably comprises switching devices provided to create a pulse width modulated signal from the storage device voltage provided to a filter wherein the on to off time is increased to ramp up the output signal or decreased to ramp down the output signal.

Preferably, when the voltage applied across the input and output is near the maximum voltage for the panel module, the switching regulator is bypassed.

Preferably, when the voltage applied across the input and output is near zero voltage, the switching regulator is bypassed.

In a preferred embodiment, each of the panel modules are switched by the control unit to control the total on time to ensure solar panels operate at or near their maximum power point.

One or more panel modules may include first and second storage devices connected in series wherein the solar panel is switched alternately across the first and second storage devices such that the second panel module provides a voltage doubling function.

One or more further panel modules may be provided having storage devices charged to voltages below the panel voltage to provide a voltage smoothing function. Preferably the storage device of each further module is charged to a lower level than a previous further panel module.

In one embodiment, one of the panel modules comprises:
a first line and a second line connected in parallel between an input and an output; and
first and second switching devices in the first line and third and fourth switching devices in the second line, the solar panel and storage device being connected across the first and second lines between the first and second switching devices and the third and fourth switching devices;
wherein switching on the first and fourth switching devices and switching off the second and third switching devices results in the storage device being connected across the input and output in a first polarity, switching off the first and fourth switching devices and switching on the second and third switching devices results in the storage device being connected across the input and output in a second opposite polarity and switching on the first and second switching devices and switching off the third and fourth switching devices results in a direct connection between the input and the output.

The switching devices may each comprise MOSFETS.

In accordance with a further aspect of the present invention, there is provided a method of converting power from a plurality of solar panels, the method comprising:

providing a plurality of panel modules each having an input and an output and being connected in series such that the output of any panel module is connected to the input of a subsequent panel module, each panel module being connected to at least one solar panel that supplies power to the panel module; and controlling the voltage applied across the input and output of each of the panel modules from a central control unit such that said voltage is varied between a maximum module voltage and a minimum module voltage;

wherein the voltage across the input and output of each of the panel modules is controlled such that the total voltage across the series connected panel modules forms an AC signal or a rectified version of an AC signal.

Preferably the control unit is in communication with a mains supply to receive information regarding the phase of the mains signal and controls the panel modules such that the AC signal or rectified AC signal is in phase with the mains supply.

Preferably each solar panel is connected to at least one storage device in the panel module and the solar panel charges the storage devices when the panel module is not supplying power to the system.

In one embodiment, the minimum module voltage is the reverse polarity of the maximum module voltage and the control unit varies the voltages supplied by the panel modules to form an AC signal. Preferably the voltage control circuitry comprises switching devices and the control unit operates the switching devices to connect the storage devices between the input and the output in a first direction to provide the maximum module voltage, in a second opposite direction to provide the minimum module voltage and bypasses the storage devices to provide zero voltage between the input and output.

In a further embodiment, the minimum module voltage is the voltage across the panel module when the storage devices are bypassed and the control unit varies the voltages supplied by the panel modules to form a rectified AC signal. Preferably, the voltage control circuitry comprises switching devices and the control unit operates the switching devices to connect the storage devices between the input and the output in a first direction to provide the maximum module voltage and bypasses the storage devices to provide zero voltage between the input and output. Preferably the control unit reverses the voltage from the series connected panels every half cycle so that the resulting voltage forms an AC signal.

In a preferred embodiment, a switching regulator is provided in each panel module connected to the storage device and the switching regulator controls the voltage provided by the storage device across the input and output of the panel module such that the voltage applied is ramped up or down to more closely approximate the mains signal.

The switching regulator preferably creates a pulse width modulated signal from the storage device voltage provided to a filter and increases the on to off time ratio to ramp up the output signal or decreases the on to off time ratio to ramp down the output signal.

Preferably, when the voltage applied across the input and output is near the maximum voltage for the panel module, the switching regulator is bypassed. Preferably, wherein when the voltage applied across the input and output is near zero voltage, the switching regulator is bypassed.

In a preferred embodiment, each of the panel modules are switched by the control unit to control the total on time to ensure solar panels operate at or near their maximum power point.

In one embodiment, one or more panel modules includes first and second storage devices connected in series and the solar panel is switched alternately across the first and second storage devices such that the second panel module provides a voltage doubling function.

One or more further panel modules may be provided having storage devices and the control unit operates the further panel modules to charge the storage devices to voltages below the panel voltage to provide a voltage smoothing function. Preferably the control unit charges the storage device of each further module to a lower level than that of a previous further panel module.

BRIEF DESCRIPTION OF THE DRAWINGS

The invention will now be described, by way of example, with reference to the following drawings in which.

DETAILED DESCRIPTION OF PREFERRED EMBODIMENTS

Figure 1:
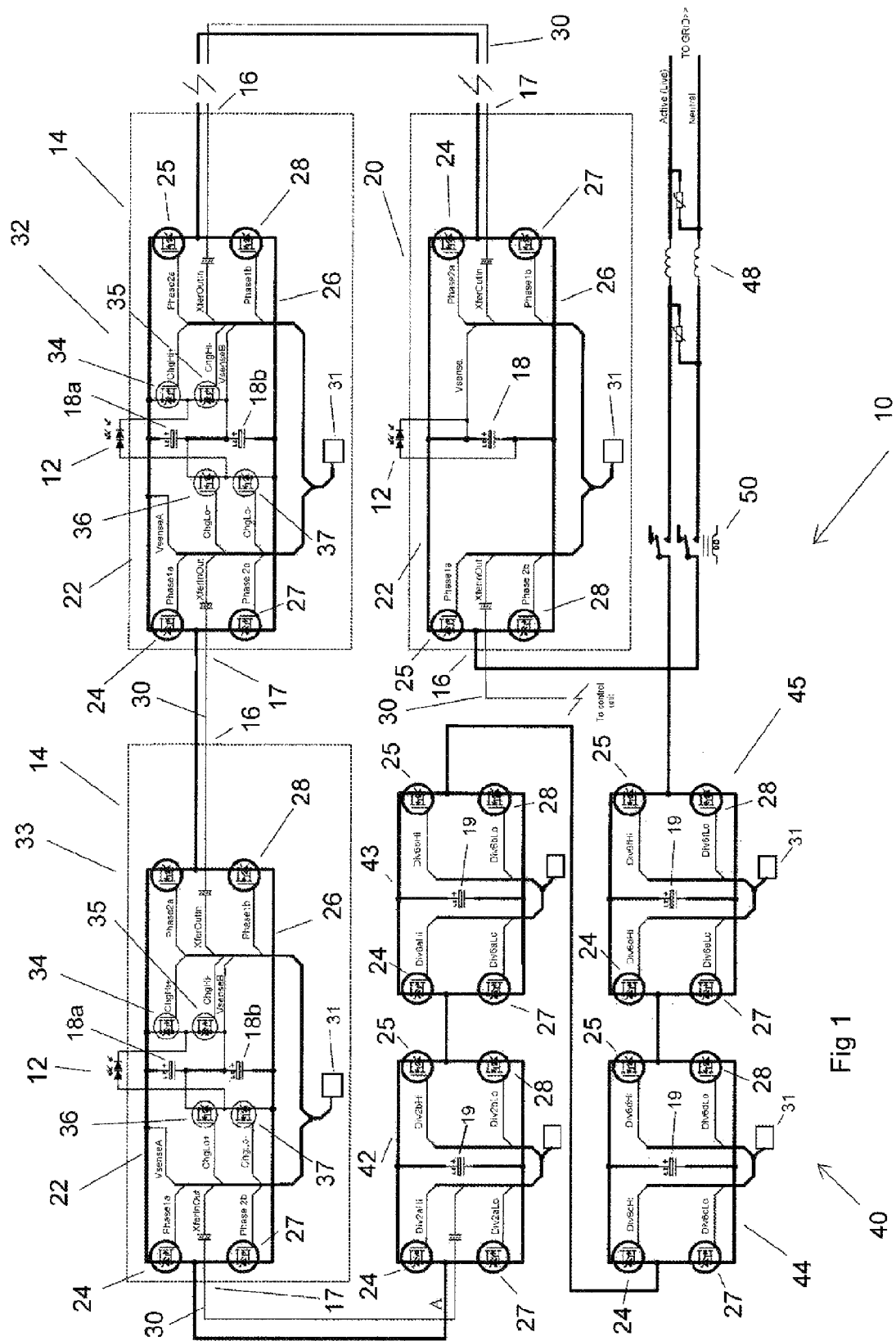
FIG. 1 is a circuit diagram of a power conversion system in accordance with the present invention and FIG. 2 is a graph showing stepwise output from the system of FIG. 1.
Figure 2:
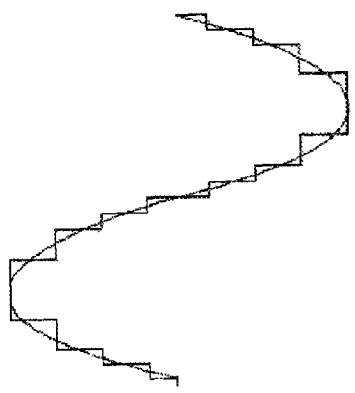

Referring to the FIGS. 1 to 2, there is shown a first embodiment of a power conversion system 10 in accordance with the present invention. The power conversion system 10 is provided for converting DC power from a plurality of solar panels 12 to AC power of the type suitable for feeding to a power grid.

The power conversion system 10 includes a plurality of panel modules 14 each associated with at least one of the solar panels 12. Each of the panel modules 14 is provided with an input 16 and an output 17. DC voltage generated by the solar panels 12 is to be provided across the input 16 and the output 17 and the panel modules 14 are to be connected in series such that the output 17 of each panel module 14 is connected to the input 16 of a subsequent panel module 14. The power conversion system 10 therefore includes a system input and a system output providing the series voltage across each of the panel modules 14. That is, the sum of the voltages provided across the inputs 16 and outputs 17 of all of the panel modules 14.

Each of the panel modules 14 is provided with voltage control circuitry to vary the voltage supplied across the input 16 and output 17 of the panel module 14. The module voltage provided across the input and output may be varied between a maximum module voltage and a minimum module voltage by the voltage control circuitry. In the embodiment shown, the voltage control circuitry includes a plurality of switching devices. In the embodiment shown, the switching devices each comprise a MOSFET. The switching devices are connected such the solar panel 12 can be switched to either provide a voltage between the input and output in a first polarity, provide a voltage between the input and output in a second polarity or bypassed. Therefore in this embodiment the maximum module voltage is the panel voltage and the minimum module voltage is the reverse polarity panel voltage.

Each of the panel modules 14 is also provided with a storage device 18 connected to the terminals of the solar panel 12. The storage devices 18 in the embodiment shown comprise electrolytic capacitors, however other devices such as polymer capacitors or rechargeable batteries may be used. The storage devices 18 store charge from the solar panel 12 such that when the panel module 14 is bypassed, power generated by the solar panel 12 continues to be stored in the storage device 18 for use.

The panel modules 14 are provided in a number of configurations. A first panel module 20 is provided such that the first panel module 20 provides power from the connected solar panel 12 and storage device 18 in first or second polarities across the input and output 16 and 17 or bypasses the panel 12 and storage module 18 such that the input 16 is connected directly to the output 17. The maximum module voltage in this case is around the panel voltage and the minimum module voltage is around the negative of the panel voltage.

The first panel module 20 comprises a first line 22 and a second line 26 connected in parallel between the input 16 and the output 17. The first line 22 is provided with first and second switching devices 24 and 25 and the second line 26 is provided with third and fourth switching devices 27 and 28. The solar panel 12 and storage device 18 are connected across the first and second lines 22 and 26 between the first and second switching devices 24 and 25 and the third and fourth switching devices 27 and 28.

The power conversion system 10 is provided with a control unit (not shown in FIG. 1) to control operation of the switching devices. The control unit is connected to a control line 30 that communicates information to each of the panel modules 14 that are connected in series and causes the switching devices to be individually switched either on or off. Each of the panel modules is provided with a local controller 31 that receives the information from the control unit. The local controllers of this embodiment provide supervisory functions, locally control the switching devices and pass information about the state of the panel module 14 back to the main control unit. While the embodiment shown utilises a cable connection to pass control information between the control unit and each of the panel modules 14, other methods may be employed. For example wireless communication methods may be used to relay information to and/or from the control unit.

In the first panel module 20, it can be seen that by switching on the first and fourth switching devices 24 and 28, and switching off the second and third switching devices 25 and 27, the storage device 18 is connected across the input 16 and output 17 in a first polarity. By switching off the first and fourth switching devices 24 and 28, and switching on the second and third switching devices 25 and 27, the storage device 18 is connected across the input 16 and output 17 in a second opposite polarity. By switching off the first and second switching devices 24 and 25 and switching on the third and fourth switching devices 27 and 28, a direct connection is made between the input 16 and the output 17 and the storage device 18 and solar panel 12 are bypassed. In the bypassed state, the energy generated by the solar panel 12 is stored in the storage device 18.

The main control unit switches each of the panel modules 14 such that the resulting output voltage of the system 10, being the sum of the voltages across the panel modules 14 comprises an AC signal. The control unit is in communication with the mains supply to receive information regarding the phase of the mains signal and controls the panel modules such that the AC signal created is in phase with the mains supply.

That is, in general, as the mains signal voltage increases in the positive portion of its cycle, the control unit sequentially switches panel modules 14 from the bypass configuration to the configuration in which the storage device 18 is connected in the first (positive) polarity to raise the system output voltage to follow the mains signal. As the mains voltage falls in the positive portion of the cycle, the control unit starts switching panel modules 14 to the bypass mode to lower the total voltage and follow the mains signal. The same occurs during the negative portion of the mains cycle with the panel modules 14 being switched such that the voltage is supplied in the second (negative) polarity to follow the mains signal. As can be seen in FIG. 2, the resulting AC signal created comprises a stepwise approximation of a sine wave.

The panel modules 14 may be arranged to provide voltage levels added to the output of the system 10 that are either multiples or fractions of the voltage generated by the solar panels 12 in order to allow closer approximation of the mains signal. In the embodiment shown, there are provided second and third panel modules 32 and 33 that provide a voltage doubling function. The arrangement of the switching devices in the second and third panel modules 32 and 33 is the same as that in the first panel module 20. The second and third panel modules 32 and 33 however are provided with first and second storage devices 18*a* and 18*b* connected in series across the first and second lines 22 and 26. Also provided are first, second, third and fourth secondary switching devices 34, 35, 36 and 37.

The first secondary switching device 34 is connected between a first terminal of the solar panel 12 and a first side of the first storage device 18*a*. The second secondary switching device 35 is connected between the first terminal of the solar panel 12 and the second side of the first storage device 18*a* (being the first side of the second storage device 18*b*). The third secondary switching device 36 is connected from a second terminal of the solar panel 12 to the second side of the first storage device 18*a*. The fourth secondary switching device 37 is connected between a second terminal of the solar panel 12 and the second side of the second storage device 18*b*.

By switching on the first and third secondary switching devices 34 and 36 and turning off the second and fourth secondary switching devices 35 and 37, the solar panel 12 can be connected across the first storage device 18*a*. By switching off the first and third secondary switching devices 34 and 36 and turning on the second and fourth secondary switching devices 35 and 37, the solar panel 12 can be connected across the second storage device 18*b*. By alternately charging the first and second storage devices 18*a* and 18*b*, the total voltage across the storage devices 18*a* and 18*b* can be brought up to around twice the voltage of the solar panel 12. The second and third panel modules 32 and 33 can therefore be switched in when larger steps in the total voltage are required to approximate the sinusoidal mains voltage. Alternatively, the first panel module 20 may be switched in the opposite polarity at the same time as either voltage doubler module 32 or 33 is switched in circuit if a smaller step is required. When panels are switched in opposite polarity, the storage device 18 of the reverse switched panel module is charged. The second and third panel modules 32 and 33 therefore act as voltage doublers which has the added advantage of reducing the number of panels required.

The power conversion system 10 is also provided with further modules 10 provided to switch voltage to more accurately approximate the sine wave signal. As it is desirable to improve EMC by not switching the solar panels on and off too quickly, higher frequency switching is performed by these further modules separate of the solar panels. It is desirable to not inject high frequencies into the grid power and this process ensures capacitance 15 between a solar panel and an earthed metal roof does not cause these unwanted signals to be conducted back down the grid power lines.

In the embodiment shown, there are four such further modules 40. Each of the further modules 40 is of a similar configuration to the first panel module 20 in that it includes first, second, third and fourth switching devices and a storage device 19 connected in the same manner. The main control unit controls the state of charge and therefore the voltage of storage devices 19 of the further modules 40 by choosing the polarity they are switched into circuit. They are discharged when switched in circuit the same way around as the panel modules and charged when switched into the opposite polarity. They are charged to provide differing voltages in each further module 40. In the embodiment shown, the first further module 42 is configured such that the storage device 19 provides a voltage of approximately that of a solar panel 12. The first further module 42 can therefore be switched in the opposite polarity to one of the second or third panel modules 32 or 33 if only a single level of increased voltage is required. The first further module 42 therefore acts as a corrector for the voltage doubler panel modules 32 and 33 and this results in the storage device 19 of the first further module 42 being charged. If the charge in the storage device 19 of the first further module 42 is sufficiently high, the first further module 42 can simply be switched on to provide the single level of voltage increase.

The second, third and fourth further modules 43, 44 and 45 are each of the same configuration and the storage devices 19 are charged to reducing voltage levels by the same process described above. In the embodiment shown, the storage device 19 of the second further module 43 is charged to around half of the panel voltage. The storage device 19 of the third further module 44 is charged to a voltage around half of that of the second further module 43 and the storage device 19 of the fourth further module 45 is charged to a voltage around half of that of the third further module 44. The second, third and fourth further modules 43, 44 and 45 can therefore be switched to provide smaller steps in voltage and act as voltage smoothers.

The system 10 is provided also with a main power inductor 48 connected in series with the panel modules 14 to smooth the switched voltage. A main relay 50 is provided to switch power from the system 10 to the main grid line.

High voltage capacitors are provided in series with the control lines to ensure 20 safety and stop corrosion on these lines from anodic or cathodic conduction. Information passed along the control lines 30 could be delayed as it transfers through each panel module 14 but if so then the delay will be known or determinable so each module knows at what time to switch. This is important in situations where for instance one panel is to be turned on and another 25 turned off. As the delay is known both switch synchronously thus reducing ripple and improving the EMC of spikes from the system.

Information could be transmitted in both directions, to and from the control unit, and include control information such as when modules should switch and in what way they should switch. Information could also be detailed and include information such as a module's maximum power point or operating voltage. The step voltage could also be measured at the terminals marked A and B in the drawings. Communication is momentarily delayed during switching and in this way reliable communications continues across the switching event.

The present system operates at lower voltages than traditional inverters. Generally such inverters operate at the series wired voltage of all solar panels, which is typically above 400 volts. In the present system, the MOSFETS operate at around 50 volts and can therefore have a much lower on resistance than high voltage MOSFETS and do not have the wasted power of IGBTs. This is expected to improve the overall efficiency of the present system relative to known systems. Also, the lower voltage will result in improved reliability. When relay 50 is switched off and each panel module is commanded to bypass, the system electrically shuts down and is safe for maintenance work to be performed.

The main inductor 48 smooths around 12V instead of 400V resulting in considerably less loss per cycle. This also means that the inductor can be much smaller.

The present system also allows control over the operation of the solar panels to ensure the panels are operating near their maximum power point. The system is provided with a means to measure the voltage across the energy storage devices 18 as the energy storage device charges. By utilising this measured voltage and the rate of change of voltage, it can be determined whether the panel is operating above or below the maximum power point.

While the solar panels 12 are switched in and out, the main control unit will control the total on time to ensure solar panels 12 operate at their maximum power point. This control can be exercised for each panel independently so that panels can operate near the maximum power point regardless of factors such as panel age and the amount of light being received.

In a further embodiment each of the panel modules 14 is provided with a switching regulator. The switching regulator is provided connected to the storage device 18. The switching regulator controls the voltage provided by the storage device 18 across the input 16 and output 17. In particular, the switching device controls the rate of change of voltage across the input 16 and output 17. The switching regulator allows the voltage applied by the storage device 18 to be ramped up or down to more closely approximate the sinusoidal mains signal, rather than the stepwise approximation of the embodiment shown in FIG. 1. The switching regulator is controlled by the control unit, which senses the mains voltage signal, such that the voltage applied by the storage device 18 can be appropriately regulated.

When the required output voltage of the panel module is near the maximum or minimum levels, the switching regulator may be bypassed. This bypassing of the switching regulator when not required will eliminate the losses inside the switching regulator during the period it is not required.

Figure 3:
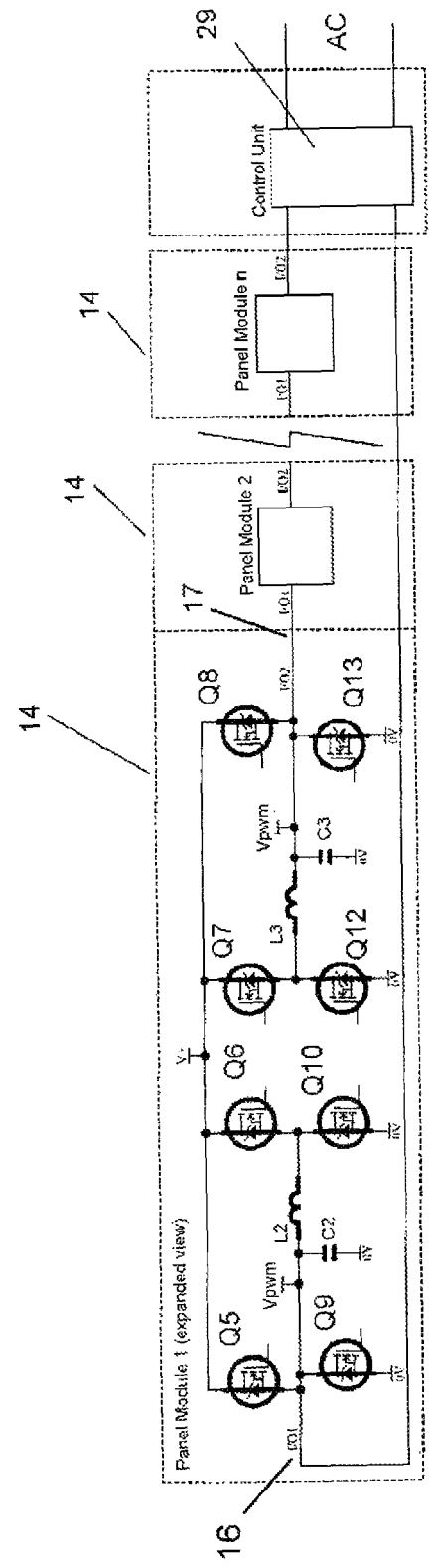
FIG. 3 is a circuit diagram of an alternative embodiment of circuitry provided within a panel module.

FIG. 3 shows a circuit diagram of circuitry of a panel module 14 of this type. The solar panels 12 and the storage devices 18 are not shown in this diagram for clarity. The voltage from the storage devices 18 is provided to the circuit at V+ from the storage devices 18 as previously.

The switching regulator function is provided by a first pair of regulator switching devices Q7 and Q12 and a second pair of regulator switching devices Q6 and Q10. First, second, third and fourth switching devices Q8, Q5, Q13 and Q9 are used to control the voltage applied across the input and output in a similar manner to the first embodiment. All of the switching devices are controlled by the control unit 29.

When it is required to ramp up the voltage during the positive portion of the AC cycle, Q7 is first switched on for a period required to charge the inductor L1 to have similar current as that flowing from terminal I/O1 to I/O2 and then Q13 is switched off. The first pair of regulator switching devices Q7 and Q12 are then used to create a pulse width modulated signal applied to a filter comprising inductor L3 and capacitor C3. Q7 and Q12 are alternatively switched on and the percentage of time that Q7 is on relative to Q12 is increased. The voltage at Vpwm on the output 17 side increases smoothly and in proportion to the PWM by virtue of the inductor L3 and capacitor C3. The slew rate is preferably controllable by the control unit. During this time, switching devices Q9 and Q10 are on to bypass the input side of the circuit. Once full voltage is reached, switching device Q8 is turned on to provide the full voltage across the input 16 and output 17.

When it is required to ramp down the voltage, Q8 is turned off in a controlled way to enable the current through inductor L1 to again match the current flowing from terminal I/O1 to I/O2 and then the reverse ramping process occurs. That is, the time Q7 is on relative to Q12 is decreased to zero to ramp down the voltage. Switching device Q13 is then turned on to bypass the output side of the circuit.

During the negative portion of the cycle, the same process as above is performed but with the second pair of regulator switching devices Q6 and Q10 being switched to control the voltage created at Vpwm on the input 16 side while switching device Q9 is turned off.

Two or more panel modules may provide PWM ramping at the same time with the control unit using an overlap of PWM to provide a smooth transition of ramping from one panel module to another. The system can in this case operate without first, second, third and fourth switching devices Q8, Q5, Q13 and Q9.

Figure 4:
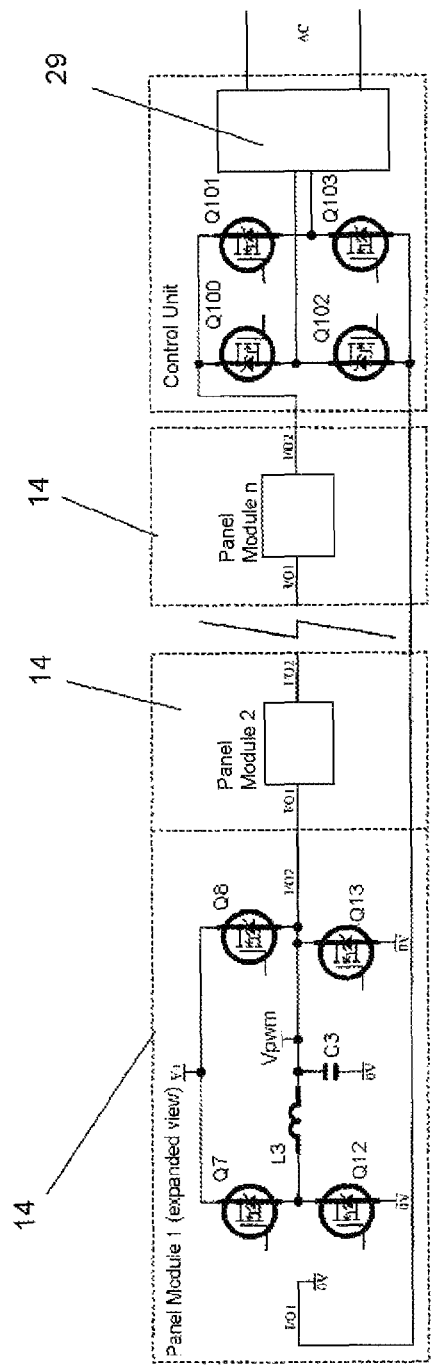
FIG. 4 is a circuit diagram of a further alternative embodiment of the panel module.

FIG. 4 shows a further alternative embodiment of the arrangement of the panel module 14. The circuit of FIG. 4 is similar to that of FIG. 3 however only one side is provided to create only a unidirectional waveform. The series connected panel modules therefore create a rectified version of an AC signal. Switching devices Q100, Q101, Q102 and Q103 in the control unit are then provided to convert to the full waveform by switching on Q100 and Q103 during one half cycle and switching on Q101 and Q102 during the alternate half cycle.

In a further embodiment, a further storage device receiving power from the solar panel 12 and further switching regulator between this further storage device and the storage device 18 may be provided across the solar panel terminals for maximum power point tracking and to increase the voltage from the solar panel 12 in an alternate way to the voltage doubler modules 32 and 33. The further storage device will have much less capacity than the energy storage devices 18 and is provided such that less power is used during maximum power point tracking. To measure the maximum power point, this further switching regulator first draws extra power from the further storage device so the solar panel voltage drops then the further switching regulator open circuits the further storage device and analyses the rates of change of voltage as the energy storage device is charged from the solar panel. The maximum power point is then determined as described previously. The further switching regulator is operated at the MPP to harvest optimal energy from the solar panel while the maximum power point is not being measured.

Also, a means is provided to measure the common mode current to the solar panel, periodically isolating the solar panel and measuring the common current to and from the panel. This is provided to improve safety and check the panels for damage or corrosion. The measured leakage current is communicated to the control unit and warnings or a system shutdown activated according to heuristics programmed into the control unit. The control unit uses this information to calculate both the DC leakage current and AC capacitance of the panel by taking into account the rates of change of the currents while the measurements are being taken.

The control unit may be configurable by a device having a user interface. The control unit may be configurable such that the system produces an output of a configured voltage level and frequency. The system will then produce this voltage level and frequency as long as there are sufficient panel modules and while the detected mains signal is within an acceptable range of the configured voltage and frequency. Alternatively, if the system is not connected to a mains supply and used to supply standalone power, the system will simply provide the configured voltage and frequency. The control unit may therefore be configured to provide power to 110V, 240V and 415V systems from the user interface as long as sufficient panel modules are provided in the system.

Also, one or more panel modules could operate with a single polarity only. In this arrangement, the control means either controls other panel modules to provide the required reverse polarity or incorporates a switching means that converts unidirectional voltages received from panel modules to an AC signal for driving the mains terminals.

Also the control means may incorporate a switching regulator in place of some or all of the smoothing modules, the switching regulator being used to compensate for the voltages received from the panel modules.

It will be readily apparent to persons skilled in the relevant arts that various modifications and improvements may be made to the foregoing embodiments, in addition to those already described, without departing from the basic inventive concepts of the present invention.

For instance, the solar panels could be replaced with batteries so that base load energy storage and recovery is provided. To achieve this, the same hardware could be used, however, the control means would be reconfigured to provide appropriate charge currents to the batteries when energy is to be stored.

One skilled in the art would realise that any number of panel modules may be used rather than just the three shown in FIG. 1. Also, bypassing the panels as described in relation to the embodiment of FIG. 3 is not required for suitable operation. For example, all series panel modules could provide PWM ramping at the same time thus forming an AC sine waveform across terminals 16 and 17 of each panel module. The control unit 29 would provide synchronizing, voltage and/or control information to the panel modules so that the series connected modules provide AC power that can be fed to a power grid.

The invention claimed is:

1. A power conversion system for converting power from a plurality of solar panels, the system comprising:
   a plurality of modules each having an input, an output and a storage device and being connected in series, one or more of said modules comprising panel modules wherein each panel module is connected to at least one solar panel that supplies power to the storage device within the panel module;
   voltage control circuitry provided within each of the modules to vary a voltage supplied between the input and the output by the storage device between a maximum panel module voltage and a minimum panel module voltage; and
   a control unit in communication with the voltage control circuitry of each of the panel modules such that the control unit varies a voltage supplied across the input and output of each of the panel modules such that the total voltage across the series connected panel modules forms an AC signal or a rectified version of an AC signal, wherein at least one of the modules includes a voltage smoothing function by controlling the voltage provided by the storage device to apply a voltage between the input and the output of the module between said maximum and minimum panel module voltages such that the total voltage across the series connected modules more closely approximates a mains signal.

2. A power conversion system in accordance with claim 1, wherein the control unit controls the panel modules such that the AC signal or rectified AC signal is in phase with a mains supply.

3. A power conversion system in accordance with claim 2, wherein the control unit controls the panel modules such that the system output voltage follows the mains signal.

4. A power conversion system in accordance with claim 1, wherein the minimum module voltage is the reverse polarity of the maximum module voltage and the control unit varies the voltages supplied by the panel modules to form an AC signal.

5. A power conversion system in accordance with claim 4, wherein the voltage control circuitry comprises switching devices connected such that the switching devices are operable to connect the storage devices between the input and the output in a first direction to provide the maximum module voltage, in a second opposite direction to provide the minimum module voltage and operable to bypass the storage devices.

6. A power conversion system in accordance with claim 5, wherein the minimum module voltage is the voltage across the panel module when the storage devices are bypassed and the control unit varies the voltages supplied by the panel modules to form a rectified AC signal.

7. A power conversion system in accordance with claim 6, wherein the voltage control circuitry comprises switching devices connected such that the switching devices are operable to connect the storage devices between the input and the output in a first direction to provide the maximum module voltage and operable to bypass the storage devices to provide zero voltage between the input and output.

8. A power conversion system in accordance with claim 6, wherein the control unit includes circuitry to reverse the voltage from the series connected panels every half cycle so that the resulting voltage forms an AC signal.

9. A power conversion system in accordance with claim 1, wherein each of the panel modules are switched by the control unit to control the total on time to ensure solar panels operate at or near their maximum power point.

10. A power conversion system in accordance with claim 1, wherein one of the modules includes a doubling function such that the module can provide a maximum panel voltage between the input and the output being twice the panel voltage.

11. A power conversion system in accordance with claim 1, wherein the voltage smoothing function is provided by one or more further modules, the main control unit controlling the state of charge and therefore the voltage of the storage devices of the further modules by choosing the polarity they are switched into the circuits and the storage device of each further module being charged to lower voltage level than a previous further module.

12. A power conversion system in accordance with claim 11, wherein the storage device of each further module is charged to around half of the voltage of the previous further module and the further modules being switched to provide smaller steps in voltage.

13. A power conversion system in accordance with claim 1, wherein the voltage smoothing function is provided by a switching regulator provided in one or more of the modules, the switching regulator being connected to the storage device to control the voltage provided by the storage device across the input and output of said module such that the voltage applied is ramped up or down to more closely approximate the mains signal.

14. A power conversion system in accordance with claim 13, wherein the switching regulator comprises switching devices provided to create a pulse width modulated signal from the storage device voltage provided to a filter wherein the on to off time is increased to ramp up the output signal or decreased to ramp down the output signal.

15. A power conversion system in accordance with claim 14, wherein once full voltage is reached a bypass switching device of the switching regulator is turned on to provide the full voltage across the input and the output.

16. A power conversion system in accordance with claim 1, wherein the control unit is connected to a control line that communicates information to the modules and wherein each of the panel modules is provided with a local controller that receives the information from the control unit and provides supervisory functions, provides local control of the switching devices and passes information about the state of the panel module back to the main control unit.

17. A power conversion system in accordance with claim 1, wherein information transferred from the control unit to the modules is delayed and the delay is known or determinable such that where one is panel turned on and another turned off, both switch synchronously thus reducing ripple and improving the EMC of spikes from the system.

18. A method of converting power from a plurality of solar panels, the method comprising:
   providing a plurality of modules each having an input, an output and a storage device being connected in series, one or more of said modules comprising panel modules, wherein each panel module is connected to at least one solar panel that supplies power to the storage device within the module; and
   controlling the voltage applied by the storage device across the input and output of each of the modules from a central control unit to vary said voltage between a maximum panel module voltage and a minimum panel module voltage such that the total voltage across the series connected panel modules forms an AC signal or a rectified version of an AC signal, wherein providing a smoothing function is provided in at least one of the modules such that the voltage provided by the storage device between the input and output of said module is controlled to be between the minimum and maximum panel module voltages such that the total voltage across the series connected modules more closely approximates a mains signal.

19. A method in accordance with claim 18, wherein the control unit is in communication with a mains supply to receive information regarding the phase of the mains signal and controls the panel modules such that the AC signal or rectified AC signal is in phase with the mains supply.

20. A method in accordance with claim 19, wherein the control unit controls the panel modules such that the system output voltage follows the main signal.

21. A method in accordance with claim 18 wherein each of the panel modules are switched by the control unit to control the total on time to ensure solar panels operate at or near their maximum power point.

22. A method in accordance with claim 18, wherein the module includes a doubling function such that the module can provide a maximum panel voltage between the input and the output being twice the panel voltage.

23. A method in accordance with claim 18, wherein the voltage smoothing function is provided by one or more further modules, the main control unit controlling the state of charge and therefore the voltage of the storage devices of the further modules by choosing the polarity they are switched into the circuit and the storage device of each further module being charged to lower voltage level than a previous further module.

24. A method in accordance with claim 23, wherein the storage device of each further module is charged to around half of the voltage of the previous further module wherein the further modules are switched to provide smaller steps in voltage.

25. A method in accordance with claim 18, wherein the voltage smoothing function is provided by a switching regulator provided in one or more of the modules connected to the storage device, the switching regulator controlling the voltage provided by the storage device across the input and output of said module such that the voltage applied is ramped up or down to more closely approximate the mains signal.

26. A method in accordance with claim 25, including the step of the switching regulator creating a pulse width modulated signal from the storage device to be provided to a filter where the one to off time is increased to ramp up the output signal or decreased to ramp down the output signal.

27. A method in accordance with claim 25, wherein once full voltage is reached, a further switching device is turned on to provide the full voltage across the input and output.

28. A method in accordance with claim 27, wherein the minimum module voltage is the reverse polarity of the maximum module voltage and the control unit varies the voltages supplied by the panel modules to form an AC signal.

29. A method in accordance with claim 28, wherein the voltage control circuitry comprises switching devices and the control unit operates the switching devices to connect the storage devices between the input and the output in a first direction to provide the maximum module voltage, in a second opposite direction to provide the minimum module voltage and bypasses the storage devices to provide zero voltage between the input and output.

30. A method in accordance with claim 29, wherein the minimum module voltage is the voltage across the panel module when the storage devices are bypassed and the control unit varies the voltages supplied by the panel modules to form a rectified AC signal.

31. A method in accordance with claim 30, wherein the voltage control circuitry comprises switching devices and the control unit operates the switching devices to connect the storage devices between the input and the output in a first direction to provide the maximum module voltage and bypasses the storage devices to provide zero voltage between the input and output.

32. A method in accordance with claim 31, wherein the control unit reverses the voltage from the series connected panels every half cycle so that the resulting voltage forms an AC signal.

33. A method in accordance with claim 18, wherein the control unit communicates information to the modules and wherein each of the panel modules via a control line and a local controller within each module that receives the information from the control unit and provides supervisory functions, provides local control of the switching devices and passes information about the state of the panel module back to the main control unit.

34. A method in accordance with claim 18, wherein information transferred from the control unit to the modules is delayed and the delay is known or determinable such that where one panel is turned on and another turned off, both switch synchronously thus reducing ripple improving the EMC of spikes from the system.

* * * * *